United States Patent
Won et al.

(10) Patent No.: US 8,461,763 B2
(45) Date of Patent: Jun. 11, 2013

(54) ELECTRON CYCLOTRON ION SOURCE AND MANUFACTURING METHOD THEREOF

(75) Inventors: Mi-Sook Won, Busan (KR); Byoung-Seob Lee, Daejeon (KR); Jong-Pil Kim, Busan (KR); Jang-Hee Yoon, Busan (KR); Jong Seong Bae, Busan (KR); Jeong Kyu Bang, Busan (KR); Hyosang Lee, Gyeongsangnam-do (KR); Jinyong Park, Busan (KR)

(73) Assignee: Korea Basic Science Institute (KR)

( * ) Notice: Subject to any disclaimer, the term of this patent is extended or adjusted under 35 U.S.C. 154(b) by 314 days.

(21) Appl. No.: 13/000,501

(22) PCT Filed: Nov. 16, 2009

(86) PCT No.: PCT/KR2009/006707
§ 371 (c)(1),
(2), (4) Date: Feb. 25, 2011

(87) PCT Pub. No.: WO2010/058930
PCT Pub. Date: May 27, 2010

(65) Prior Publication Data
US 2011/0140641 A1 Jun. 16, 2011

(30) Foreign Application Priority Data
Nov. 20, 2008 (KR) .................. 10-2008-0115897

(51) Int. Cl.
*H01J 7/24* (2006.01)

(52) U.S. Cl.
USPC ............ 315/111.81; 315/111.41; 315/502; 118/723 MA; 118/723 MR; 438/728; 250/423 R; 250/424

(58) Field of Classification Search
USPC ... 315/501, 502, 111.41, 111.81; 118/723 MA, 118/723 MR; 156/345.42, 345.46, 345.48; 250/492.21, 423 R, 424; 204/298.37–298.39; 438/728, 729
See application file for complete search history.

(56) References Cited

U.S. PATENT DOCUMENTS

| | | | | | |
|---|---|---|---|---|---|
| 4,952,273 | A | * | 8/1990 | Popov | 216/70 |
| 5,504,340 | A | * | 4/1996 | Mizumura et al. | 250/492.21 |
| 5,523,652 | A | * | 6/1996 | Sferlazzo et al. | 315/111.41 |
| 5,985,091 | A | * | 11/1999 | Suzuki | 156/345.42 |
| 6,271,529 | B1 | * | 8/2001 | Farley et al. | 250/492.21 |
| 6,506,687 | B1 | * | 1/2003 | Izawa et al. | 438/729 |

FOREIGN PATENT DOCUMENTS

| | | |
|---|---|---|
| JP | 05106051 A | 4/1993 |
| JP | 05315097 A | 11/1993 |
| JP | 06124674 A | 6/1994 |

* cited by examiner

*Primary Examiner* — Haiss Philogene
(74) *Attorney, Agent, or Firm* — Jansson Munger McKinley & Shape Ltd.

(57) ABSTRACT

An apparatus of an electron cyclotron resonance ion source may include: a magnet unit containing a magnet for generating magnetic fields; an ionizing chamber housing unit for generating ions through electron cyclotron resonance from a plasma; a microwave generating unit for injecting microwaves to the ionizing chamber housing unit to generate ions; and a beam integrating and guiding unit for treating the generated ions. The magnet unit may include: a bobbin for winding the magnet; a variable spacer for dividing the bobbin into a plurality of sections; and the magnet which is wound into the form of a wire or a tape in the plurality of sections formed by the variable spacer.

12 Claims, 2 Drawing Sheets

ELECTRON CYCLOTRON ION SOURCE AND MANUFACTURING METHOD THEREOF

FIELD OF INVENTION

The present invention relates to an electron cyclotron resonance ion source apparatus and a method of manufacturing the same, specifically to an electromagnet or a superconducting magnet capable of varying cross-sectional shape for generation of magnetic fields. More particularly, it relates to an apparatus of an electron cyclotron resonance ion source capable of supplying ions for X-ray analysis, material etching, particle accelerators, or the like by providing an electromagnet or a superconducting magnet with a cross-sectional shape optimized for the required magnetic field and a manufacturing method thereof.

BACKGROUND OF THE INVENTION

Generally, a variety of electron cyclotron resonance ion sources are used in many applications because ions can be generated at relatively low cost. The electron cyclotron resonance ion sources are used in various forms in many applications.

For example, there have been several successful proposals for large-area ionization using a permanent magnet for material etching and a solenoid mirror electromagnet with a copper wire having a cooling channel inside. In addition, studies are being carried out about X-ray ion source as a safe, compact, inexpensive and, in particular, portable ion source, although further efforts are necessary for beam integration and guiding since the image resolution is not enough and the emission area is large.

Further, electron cyclotron resonance is employed as an ion injection source of a heavy-ion linear accelerator and a cyclotron for generating radioactive isotopes for medical and material research.

However, when a permanent magnet or a combination of solenoid electromagnets is used to generate a large-area mirror magnetic field, a space of ten to hundreds times that of the area of the magnetic field needed in the ionizing chamber housing is required for installation of the magnet. This inevitably increases the apparatus size and becomes a hindrance to increasing the ionization area.

A stronger mirror magnetic field is required to improve resolution of X-ray images and generate multiply charged ions for a particle accelerator. For this, use of a superconducting magnet has been found useful. However, since it requires an additional device to keep cryogenic temperatures, problems of portability and maintenance cost remain. Recently, a refrigerator was used solve the portability problem and various efforts are being made to reduce the maintenance cost. However, such application is restricted due to the use of expensive superconducting wire. Moreover, it is expected that the limit of the critical magnetic field will soon be reached. Therefore, developing an ion source capable of replacing those that currently exist is desirable.

SUMMARY OF THE INVENTION

In order to overcome the problems of the conventional technique, an aspect of the present invention is directed to providing an electron cyclotron resonance ion source enabling generation of required magnetic fields using a magnet configured with minimized volume. Such configuration allows the cyclotron to be installed, in a restricted space, reducing manufacturing cost for the cooling apparatus and electromagnet, and enabling control of cross-sectional shape of the magnet according to a required magnetic field gradient.

According to an embodiment, an electron cyclotron resonance ion source apparatus may include a magnet unit including a magnet for generating magnetic fields; an ionizing chamber housing unit for generating ions through electron cyclotron resonance from a plasma; a microwave generating unit for injecting microwaves to the ionizing chamber housing unit to generate ions; and a beam integrating and guiding unit for treating the generated ions. The magnet unit may include a bobbin for winding the magnet; a variable spacer for dividing the bobbin into a plurality of sections; and the magnet being wound into the form of a wire or a tape in the plurality of sections formed by the variable spacer. The magnet wound into the form of a wire or a tape may be connected to one power source to generate magnetic fields. The magnitude and distribution of the magnetic fields generated by the magnet unit may be adjusted by varying the shape of the variable spacer.

According to another embodiment, an electron cyclotron resonance ion source apparatus may include a magnet unit for generating magnetic fields including a plurality of magnets in the form of plates having a different thickness or radius; an ionizing chamber housing unit for generating ions through electron cyclotron resonance from a plasma; a microwave generating unit for injecting microwaves to the ionizing chamber housing unit to generate ions; and a beam integrating and guiding unit for treating the generated ions, wherein the magnitude and distribution of the magnetic fields generated by the magnet unit are adjustable by varying the gaps between the plurality of magnets in the form of plates.

The electron cyclotron resonance ion source according to the present invention is compact and minimizes electromagnet material consumption since the magnet is configured to have a minimized, arbitrary cross-sectional shape according to the required magnetic field gradient, instead of being configured with coils.

Further, an economical electron cyclotron resonance ion source apparatus providing a strong magnetic field may be implemented by employing a solenoid magnet or a Bitter magnet having minimized, arbitrary cross-sectional shape for configuration of a power source alone or in combination.

In addition, a variety of electron cyclotron resonance ion source apparatus may be provided considering market needs and limitation of installation space In addition, the cost of manufacturing a number of such apparatus can be minimized.

Furthermore, an electron cyclotron resonance ion source apparatus is capable of supplying ions using an electromagnet or a superconducting magnet configured to have a cross-sectional shape optimized for magnetic fields required for X-ray analysis, material etching, particle acceleration or the like.

A method of manufacturing an electron cyclotron resonance ion source according to the present invention includes providing a magnet unit comprising a magnet for generating magnetic fields and generating ions within an ionizing chamber housing unit through electron cyclotron resonance from a plasma. Microwaves are injected through a a microwave generating unit into the ionizing chamber housing for generating ions and the generated ions are treated through a beam integrating and guiding unit, providing a bobbin for winding the magnet. The method also includes providing a variable spacer for dividing the bobbin into a plurality of sections: winding the magnet into the form of a wire or a tape in the plurality of sections formed by the variable spacer, connecting the wound magnet to one power source to generate magnetic fields, and adjusting the magnitude and distribution of the magnetic fields generated by the magnet unit by varying the shape of the variable spacer.

DESCRIPTION OF DRAWINGS

In order that the advantages of the invention will be readily understood, a more detailed description of the invention briefly described above will be rendered by reference to specific embodiments that are illustrated in the appended drawings. Understanding that these dxrawings depict only typical embodiments of the invention and are not therefore to be considered to be limiting of its scope, the invention will be described and explained with additional specificity and detail through the use of the accompanying drawings, in which.

DETAILED DESCRIPTION

Exemplary embodiments now will be described more fully hereinafter with reference to the accompanying drawings, in which exemplary embodiments are shown. The present disclosure may, however, be embodied in many different forms and should not be construed as limited to the exemplary embodiments set forth therein.

Now, an apparatus of an electron cyclotron resonance ion source according to an embodiment of the present invention will be described in detail referring to the attached drawings.

Figure 1:
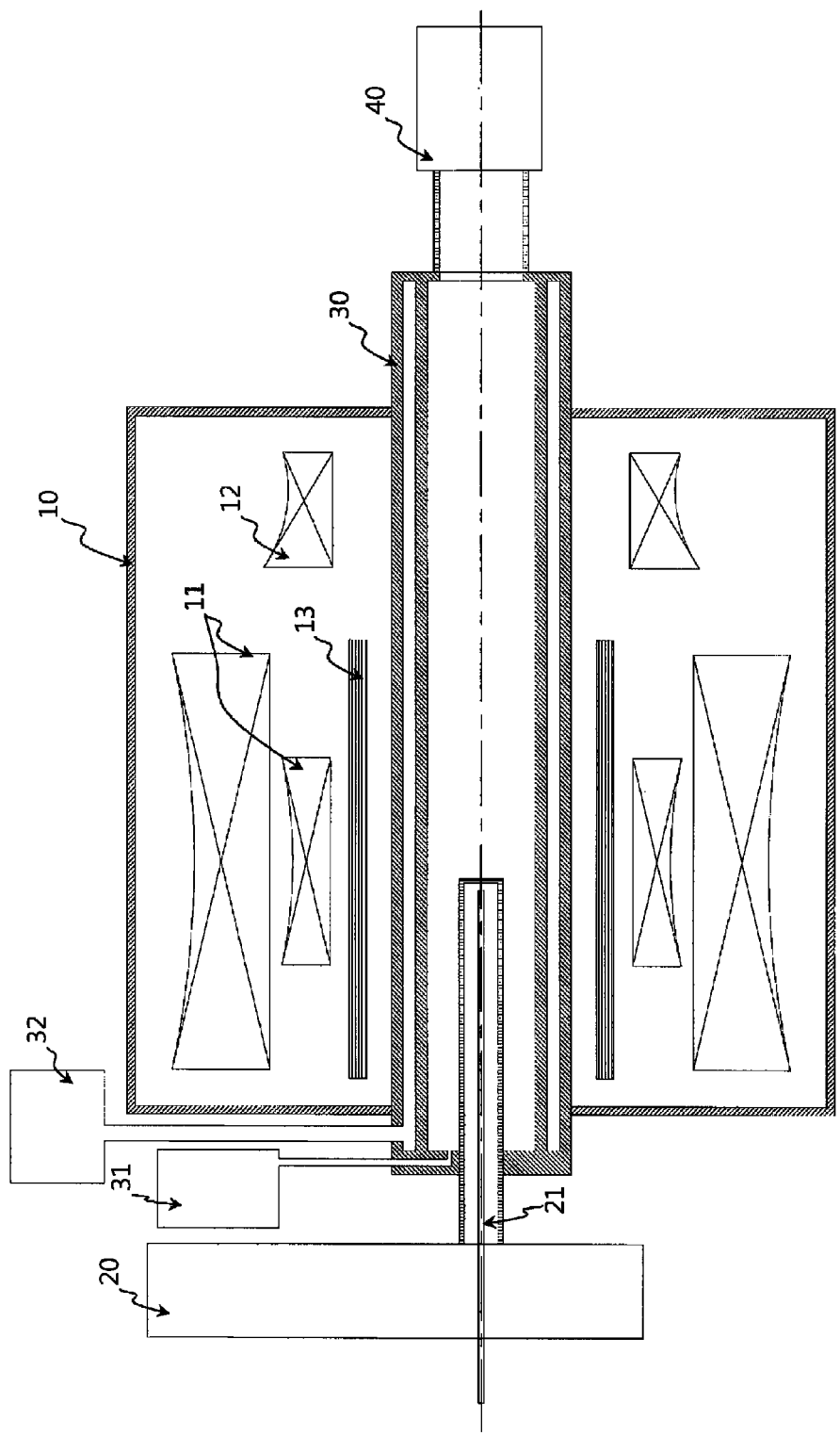
FIG. 1 schematically illustrates an apparatus of an electron cyclotron resonance ion source according to an embodiment of the present invention.
Figure 2:
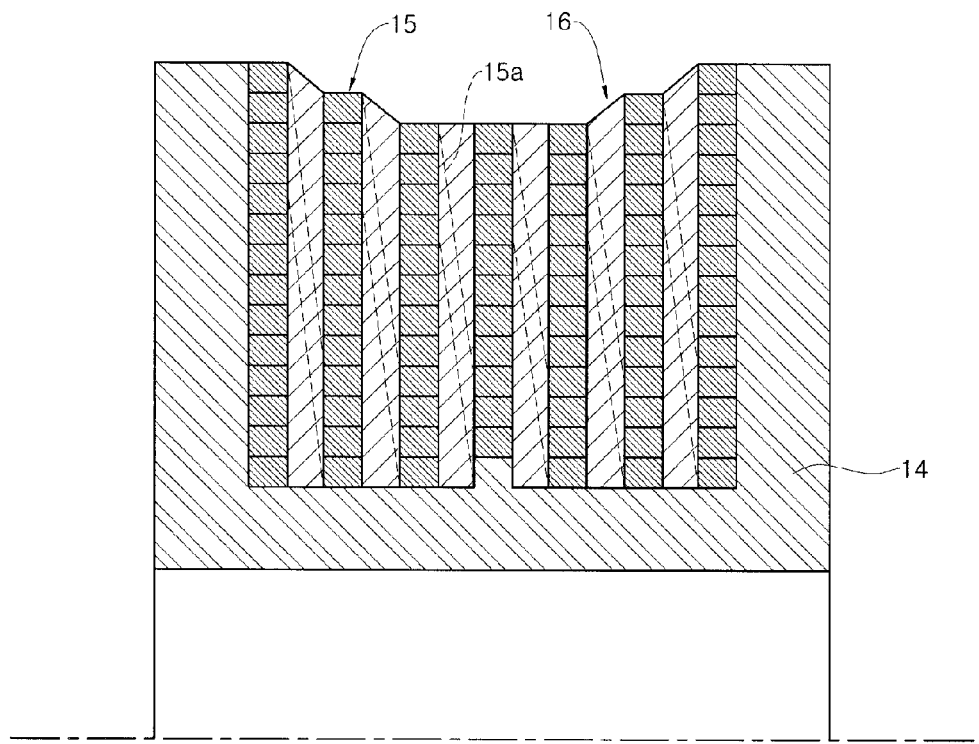
FIG. 2 is a schematic diagram showing a magnet unit of an apparatus of an electron cyclotron resonance ion source according to an embodiment of the present invention.
Figure 3:
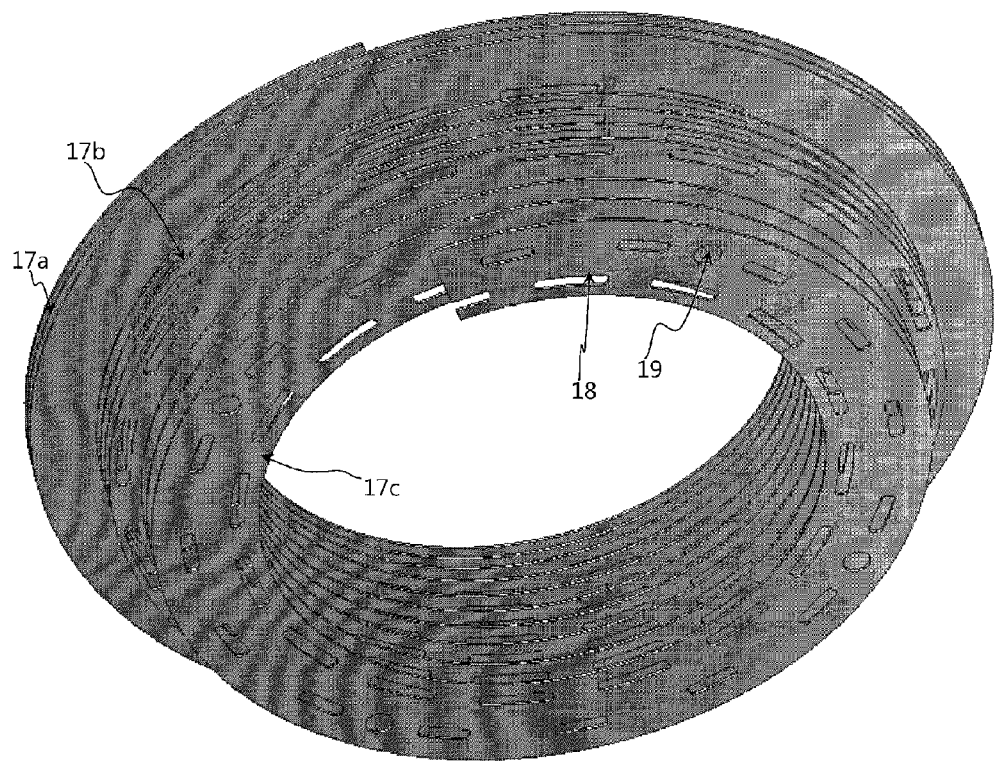
FIG. 3 is a schematic diagram showing a magnet unit of an apparatus of an electron cyclotron resonance ion source according to another embodiment of the present invention.

FIG. 1 schematically illustrates an electron cyclotron resonance ion source apparatus according to an embodiment of the present invention. FIG. 2 is a schematic diagram showing a magnet unit of an electron cyclotron resonance ion source apparatus according to an embodiment of the present invention having a magnet in the form of a wire or a tape. FIG. 3 is a schematic diagram showing a magnet unit of an electron cyclotron resonance ion source apparatus according to another embodiment of the present invention having a Bitter magnet.

Referring to FIG. 1, an electron cyclotron resonance ion source apparatus comprises a magnet unit 10 for generating magnetic fields, an ionizing chamber housing unit 30 for generating ions through electron cyclotron resonance from a plasma, a microwave generating unit 20 for injecting microwaves to generate ions; and a beam integrating and guiding unit 40 for treating and using the generated ions.

Operation of the apparatus of an electron cyclotron resonance ion source includes generating magnetic fields with magnet unit 10, which comprises a mirror magnet 11 and provides a mirror magnetic field confining electrons, a polarizing magnet 13 which provides polarization and a guiding magnet 12 which guides beams or microwaves. Under a magnetic field atmosphere, the inside of the ionizing chamber housing unit 30, which comprises a gas control unit 31 and a chamber cooling unit 32, is vacuumized using the gas control unit 31. After supplying a gas required for plasma generation using the gas control unit 31, pressure is adjusted.

After the magnetic field and gas atmosphere suitable for plasma generation is created, microwaves generated by the microwave generating unit 20, which may be a magnetron or a gyrotron, are injected to the ionizing chamber housing unit 30 via an antenna unit 21. Thereafter, when a voltage is applied to the ionizing chamber housing unit 30, ions are generated through electron cyclotron resonance of a generated plasma.

The ionizing chamber housing unit 30 comprises an ion extraction device and a guide for emitting the generated ions toward the outside thereof. The ions extracted from the electron cyclotron resonance ion source apparatus are affected by various parameters. In particular, they are affected by the magnetic fields generated by the magnet unit 10, the microwaves generated by the microwave generating unit 20, the kind and density of gas supplied to the ionizing chamber housing unit 30, the voltage applied thereto, and the type of the extraction and guide devices.

The electron cyclotron resonance ion source apparatus according to an embodiment of the present invention may have the beam integrating and guiding unit 40 configured differently depending on applications such as X-ray analysis, material etching, neutron radiography, cyclotron or linear particle acceleration.

The magnet unit 10 may comprise a permanent magnet, a magnet prepared from a copper wire or a superconducting wire having a cooling channel along the length direction, and a cooling system outside the coil using cooling water, helium or nitrogen or the like. It will also be appreciated that a refrigeration device may be used to provide the necessary cooling. As seen in FIG. 1, the magnet unit 10 comprises a mirror magnet 11, a guiding magnet 12 and a polarizing magnet 13, which are in the form of a wire or a tape made of a copper material or a superconducting material or similar material. The guiding magnet is located near the inlet or outlet of the ionizing chamber housing unit 30.

The mirror magnet 11 and the guiding magnet 12 may be prepared in the form of a solenoid with a wire or tape wound along directions perpendicular to a rotational axis of the magnet or the bobbin around which the magnet may be wound. The magnet may also be a Bitter magnet with plates of different sizes having cooling channels. The mirror magnet 11 and the guiding magnet 12 are configured to have a cross-sectional shape desired for a required magnetic field gradient and are optimized to have minimum sizes. Excessive use of the mirror magnet 11, the guiding magnet 12 and the polarizing magnet 13 included in the magnet unit 10 is unfavorable in terms of magnet efficiency. Accordingly, as seen in FIG. 2 and FIG. 3, the magnet unit having a desired cross-sectional shape is used. When a superconducting magnet having a strong magnetic field is required, the electron cyclotron resonance ion source apparatus may be implemented using a Bitter magnet configured to have a desired cross-sectional shape, rather than winding the magnet along the directions perpendicular to the rotational axis.

FIG. 2 is a schematic diagram showing a magnet unit of the electron cyclotron resonance ion source apparatus shown in FIG. 1, wherein the mirror magnet or the guiding magnet is configured in the form of a wire or a tape. A solenoid type magnet is configured using a copper or superconducting magnet 15 in the form of a wire or a tape having a cooling system inside and outside the wire. The solenoid type magnet includes a bobbin 14 which serves as a center for winding the magnet and a spacer 16 which fills the space between successive windings.

In an embodiment of the present invention, the copper or superconducting magnet 15 in the form of a wire or a tape is wound along directions perpendicular to a rotational axis. After one winding is completed, the magnet travels along the spacer 16 through a connection hole 15a between windings back to the inside of the bobbin. Then, the next winding is carried out along directions perpendicular to the rotational axis. The inner shape of the magnet may be varied by adequately processing the bobbin 14, and the outer shape is determined by the number of windings in the radial direction.

As shown in FIG. 2, the magnet unit comprises the bobbin 14 for winding the magnet 15; the spacer 16 for dividing the bobbin into a plurality of sections; and the magnet 15 which is wound into the form of a wire or a tape in the plurality of sections formed by the variable spacer 16. The magnet 15 in the form of a wire or a tape is configured in the form of one wire or tape. Since the magnet 15 is configured in the form of one wire or tape, a single current source may be used to generate magnetic fields, without the need of supplementary or additional circuitry.

The spacer 16 divides the bobbin 14 into a plurality of sections along directions perpendicular to the rotational axis. The spacer 16 may be in the form of a circular plate. By dividing the bobbin 14 into a plurality of sections, the magnetic field generation in each section may be optimized by varying the cross-sectional shape of the magnet. In each section, the number of windings may be varied to generate magnetic fields with desired intensity. By varying the radius and thickness of the spacer, the cross-sectional radius of the magnet in the form of a wire or a tape in each section may be varied. Also, the spacer is equipped with a connection hole to allow traveling of the magnet from one section to another section for winding.

The width of the divided sections may be set as desired. Whereas the radius and thickness of the spacer are variable, the width of the sections may be set constant. If the width of the section is set to be identical to the width of the wound magnet, the cross-sectional area or the radius of the wound magnet in each section increases as the number of windings increases. If the cross-section of the magnet is not rectangular but circular, the "width" may be the diameter.

If the number of windings of the magnet is n, the height of the magnet is h and the radius of the bobbin is r, the radius R of the wound magnet in each section satisfies the relationship: $R = r + n \times h$. Here, n is a natural number and r, h and R are real numbers. R is the distance from the rotational axis. If the cross-section of the magnet is rectangular, the "height" h may indicate the height of the rectangle. If the cross-section of the magnet is not rectangular but circular, the "height" h may be replaced by the diameter of the corresponding circle. Thus, the cross-sectional radius R or the cross-sectional area of the magnet in each section may be varied by varying the number of windings n of each section. As the radius or the cross-sectional area is varied, the magnitude of the generated magnetic field also varies.

FIG. 3 shows in detail a magnet unit where the mirror magnet or the guiding magnet of FIG. 1 is configured as a Bitter plate. Bitter plates 17a, 17b, 17c are used to configure a solenoid type magnet, which comprises cooling channels 18, support holes 19, supports for cooling and insulating spacers between the Bitter plates.

The magnet of FIG. 3 comprises a combination of the Bitter plates 17a, 17b, 17c having different sizes. The gap between the Bitter plates is adjusted according to the cooling capacity and the required magnetic field to configure a solenoid with a desired cross-sectional shape.

To describe in more detail referring to FIG. 3, the magnet unit comprises a plurality of magnets having different thicknesses or radius. The plurality of magnets may be plate type magnet. The plurality of magnets have cooling channels and support holes formed thereon. The plurality of magnets are connected to one another to configure one magnet unit.

In the present invention, the methods presented referring to FIG. 2 and FIG. 3 may be adopted independently or in combination to embody a compact solenoid type magnet having an arbitrary cross-sectional shape appropriate to provide various magnetic fields required by an apparatus of an electron cyclotron resonance ion source.

Hereinafter, a method of manufacturing an apparatus of an electron cyclotron resonance ion source according to an embodiment of the present invention will be described in detail. In an embodiment of the present invention, an ion source apparatus may be manufactured by dividing a bobbin which serves as a center for winding a magnet into a plurality of sections along directions perpendicular to a rotational axis; forming spacers between the divided sections; forming holes passing through a magnet in the spacers; and winding a magnet in the form of a wire or a tape in the divided sections. The cross-sectional area of the magnet wound in the form of a wire or a tape in each section may be variable. The magnitude of the generated magnetic field may be varied by changing the cross-sectional area of the magnet.

According to the method of the present invention, a bobbin for winding a magnet in the form of a wire or a tape is divided into a plurality of sections. The bobbin is divided into a plurality of sections to vary the radius or cross-sectional area of the wound magnet in each section. The plurality of sections indicate the areas where the magnet is wound. Between the sections in which the magnet is wound, there is a section where a spacer is present. The bobbin may be divided along directions perpendicular to a rotational axis, such that the sections in which the magnet is wound have a predetermined width.

According to the method of the present invention, the spacer and the magnet alternate as shown in FIG. 2, and thus, the spacers are formed considering the sections where the magnet is wound. The spacer may be formed while forming the bobbin or may be formed later using a separately fabricated circular plate member. The method may also include forming holes to allow the traveling of the magnet from one section to another after the winding is completed in the one section.

The method may also include providing a magnet in the form of a wire or a tape which is wound around the bobbin and which is divided by the spacers. The number of windings is adjusted differently in each section according to the magnetic field required by the ion source apparatus, since different magnetic fields are generated depending on the radius or cross-sectional area of the wound magnet. If the spacer is in the form of a circular plate, the magnitude of magnetic field may also be adjusted by varying the radius and thickness of the spacer.

Reference throughout this specification to "the embodiment," "this embodiment," "the previous embodiment," "one embodiment," "an embodiment," "a preferred embodiment" "another preferred embodiment" or similar language means that a particular feature, structure, or characteristic described in connection with the embodiment is included in at least one embodiment of the present invention. Thus, appearances of the phrases "in the embodiment," "in this embodiment," "in the previous embodiment," "in one embodiment," "in an embodiment," "in a preferred embodiment," "in another preferred embodiment," and similar language throughout this specification may, but do not necessarily, all refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

While the present invention has been described in connection with certain exemplary or specific embodiments, it is to be understood that the invention is not limited to the disclosed embodiments, but, on the contrary. is intended to cover various modifications, alternatives, modifications and equivalent arrangements as will be apparent to those skilled in the art. Any such changes, modifications. alternatives. modifications, equivalents and the like may be made without departing from the spirit and scope of the invention.

An aspect of the present invention relates to an apparatus of an electron cyclotron resonance ion source and a manufacturing method thereof, specifically to an electromagnet or a superconducting magnet capable of varying cross-sectional shape for generation of magnetic fields. More particularly, it relates to an apparatus of an electron cyclotron resonance ion source capable of supplying ions for X-ray analysis, material etching, particle accelerators, or the like by providing an electromagnet or a superconducting magnet with a cross-sectional shape optimized for the required magnetic field and a manufacturing method thereof.

The invention claimed is:

1. An electron cyclotron resonance ion source comprising:
   a magnet unit comprising a magnet for generating magnetic fields;
   an ionizing chamber housing unit for generating ions through electron cyclotron resonance from a plasma;
   a microwave generating unit for injecting microwaves to the ionizing chamber housing unit to generate ions; and
   a beam integrating and guiding unit for treating the generated ions,
   wherein the magnet unit comprises:
      a bobbin for winding the magnet;
      a variable spacer for dividing the bobbin into a plurality of sections; and
      the magnet which is wound into the form of a wire or a tape in the plurality of sections formed by the variable spacer,
   wherein the wound magnet is connected to one power source to generate magnetic fields, and wherein the magnitude and distribution of the magnetic fields generated by the magnet unit are adjustable by varying the shape of the variable spacer.

2. The electron cyclotron resonance ion source according to claim 1, wherein the variable spacer divides the bobbin into a plurality of sections along directions perpendicular to a rotational axis.

3. The electron cyclotron resonance ion source according to claim 2, wherein the variable spacer is in the form of a circular plate having variable thickness and radius.

4. The electron cyclotron resonance ion source according to claim 2, wherein the variable spacer has a connection hole through which the magnet wound into the form of a wire or a tape passes, wherein the wound magnet is wound in the plurality of sections divided by the variable spacer, and wherein the cross-sectional area of the wound magnet in each section is variable.

5. The electron cyclotron resonance ion source comprising:
   a magnet unit for generating magnetic fields comprising a plurality of magnets in the form of plates having different thickness or radius;
   an ionizing chamber housing unit for generating ions through electron cyclotron resonance from a plasma;
   a microwave generating unit for injecting microwaves to the ionizing chamber housing unit to generate ions; and
   a beam integrating and guiding unit for treating the generated ions,
   wherein the magnitude and distribution of the magnetic fields generated by the magnet unit are adjustable by varying the gaps between the plurality of magnets in the form of plates.

6. The electron cyclotron resonance ion source according to claim 5, wherein the plurality of magnets have cooling channels and support holes.

7. The electron cyclotron resonance ion source according to claim 5, wherein the plurality of magnets are connected to each other, and wherein a variable spacer is interposed between the plurality of magnets.

8. A method of manufacturing an electron cyclotron resonance ion source including:
   providing a magnet unit comprising a magnet for generating magnetic fields;
   generating ions within an ionizing chamber housing unit through electron cyclotron resonance from a plasma;
   injecting microwaves through a microwave generating unit into the ionizing chamber housing for generating ions; and
   treating the generated ions through a beam integrating and guiding unit,
   providing a bobbin for winding the magnet;
   providing a variable spacer for dividing the bobbin into a plurality of sections;
   winding the magnet into the form of a wire or a tape in the plurality of sections formed by the variable spacer, connecting the wound magnet to one power source to generate magnetic fields, and
   adjusting the magnitude and distribution of the magnetic fields generated by the magnet unit by varying the shape of the variable spacer.

9. The method of manufacturing an electron cyclotron resonance ion source of claim 8, including providing the magnet wound in the form of a wire or a tape with a variable cross-sectional area.

10. The method of manufacturing an electron cyclotron resonance ion source of claim 9, including varying the magnetic fields by changing the cross-sectional area of the magnet.

11. The method of manufacturing an electron cyclotron resonance ion source of claim 8, including dividing the bobbin into a plurality of sections to vary the radius or cross-sectional area of the wound magnet.

12. The method of manufacturing an electron cyclotron resonance ion source of claim 11, including dividing the bobbin along directions perpendicular to a rotational axis of the bobbin.

* * * * *

UNITED STATES PATENT AND TRADEMARK OFFICE
CERTIFICATE OF CORRECTION

| | | |
|---|---|---|
| PATENT NO. | : 8,461,763 B2 | Page 1 of 1 |
| APPLICATION NO. | : 13/000501 | |
| DATED | : June 11, 2013 | |
| INVENTOR(S) | : Mi-Sook Won et al. | |

It is certified that error appears in the above-identified patent and that said Letters Patent is hereby corrected as shown below:

On the Title page, Item (54) and in the Specification, in column 1, lines 1-2, delete the title and insert the correct title: --ELECTRON CYCLOTRON RESONANCE ION SOURCE AND METHOD OF MANUFACTURING THE SAME--

Signed and Sealed this
Twenty-sixth Day of November, 2013

Margaret A. Focarino
*Commissioner for Patents of the United States Patent and Trademark Office*